(12) United States Patent
Lang

(10) Patent No.: US 9,158,872 B2
(45) Date of Patent: Oct. 13, 2015

(54) APPARATUS, SYSTEMS, AND METHODS FOR INCREASING AIRFLOW THROUGH INDUCTION MOTORS

(75) Inventor: Nicholas G. Lang, Cincinnati, OH (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 106 days.

(21) Appl. No.: 13/613,567

(22) Filed: Sep. 13, 2012

(65) Prior Publication Data

US 2014/0070642 A1 Mar. 13, 2014

(51) Int. Cl.
*H02K 1/32* (2006.01)
*G06F 17/50* (2006.01)
*H02K 17/16* (2006.01)

(52) U.S. Cl.
CPC .............. *G06F 17/5018* (2013.01); *H02K 1/32* (2013.01); *H02K 17/165* (2013.01); *Y02T 10/82* (2013.01)

(58) Field of Classification Search
None
See application file for complete search history.

(56) References Cited

U.S. PATENT DOCUMENTS

| | | | | | |
|---|---|---|---|---|---|
| 973,565 | A | * | 10/1910 | Reist | 310/63 |
| 3,684,906 | A | * | 8/1972 | Lenz | 310/61 |
| 4,301,386 | A | * | 11/1981 | Schweder et al. | 310/59 |
| 4,331,895 | A | * | 5/1982 | Edick et al. | 310/61 |
| 4,352,034 | A | * | 9/1982 | Karhan et al. | 310/59 |
| 5,925,960 | A | * | 7/1999 | Hayes | 310/211 |
| 6,483,210 | B1 | * | 11/2002 | Soderberg | 310/52 |
| 7,028,385 | B2 | * | 4/2006 | Radomile et al. | 29/596 |
| 7,345,385 | B2 | | 3/2008 | Kreitzer | |
| 7,683,510 | B2 | | 3/2010 | Pellegrino | |
| 7,777,375 | B2 | * | 8/2010 | Pellegrino et al. | 310/61 |
| 2007/0024130 | A1 | * | 2/2007 | Schmidt | 310/61 |
| 2007/0035187 | A1 | * | 2/2007 | Verhaegen | 310/59 |
| 2008/0116754 | A1 | * | 5/2008 | Pellegrino et al. | 310/58 |
| 2009/0230790 | A1 | * | 9/2009 | Weiss | 310/61 |

FOREIGN PATENT DOCUMENTS

| | | | | |
|---|---|---|---|---|
| DE | 1099064 | * | 2/1961 | 310/61 |
| SU | 1159113 A1 | | 5/1985 | |
| WO | 2008031804 | | 3/2008 | |

OTHER PUBLICATIONS

General Electric Transportation, 1500 HP AC Drilling Motor, Models 5GEB27, 5GEb28, 5GEB29, L2A, 2008; (46 pages).

* cited by examiner

*Primary Examiner* — Tran Nguyen

(57) ABSTRACT

Induction motors may have a rotor core assembly that includes a plurality of rotor laminations having an arrangement of vents therein. The arrangement of vents may provide increased airflow through the induction motor without adversely affecting the electromagnetic properties of the motor. The arrangement of vents includes first and second circular rows of vents, wherein each vent of the first row may be radially aligned with a respective vent of the second row, and each radially aligned pair of first and second row vents may be radially aligned with a respective conductor bar slot in the rotor lamination. The number of rotor bar slots may equal the number of first row vents and the number of second row vents. Systems and methods of facilitating ventilation in an induction motor are provided, as are other aspects.

10 Claims, 8 Drawing Sheets

APPARATUS, SYSTEMS, AND METHODS FOR INCREASING AIRFLOW THROUGH INDUCTION MOTORS

FIELD

The invention relates generally to induction motors and more particularly to rotor core assemblies of induction motors.

BACKGROUND

Induction motors are a type of electric motor that may generate a large amount of heat during operation. Excessive heat can damage internal components, limit the amount of power that can be provided by the motor, and/or adversely affect the longevity of the motor. Induction motors may have fans or radial vents that can remove at least some heat from the motor by drawing cooling air through various passageways in the motor. These passageways include axial vents formed in a rotor core assembly of the motor. Axial vents may be one of the more restrictive air passageways in the motor. While large axial vents may improve the cooling efficiency of a motor because they may allow more air to flow through, large axial vents also may adversely affect the performance of the motor by impeding and/or interfering with the flow of magnetic fields through the rotor. Therefore, a need exists to improve the cooling efficiency of induction motors without adversely affecting the performance of the motor.

SUMMARY

According to a first aspect, a rotor core assembly is provided that may have improved cooling efficiency. The rotor core assembly includes a plurality of rotor laminations that each have a plurality of slots arranged around a radial periphery of the rotor lamination. Each slot passes through the rotor lamination and is configured to receive a rotor conductor bar. Each rotor lamination also has a first row of vents and a second row of vents that both pass axially through the rotor lamination. Each vent of the first row is radially aligned with a respective vent of the second row, and each pair of radially aligned first and second vents is radially aligned with a respective slot.

According to another aspect, a method of facilitating ventilation in an induction motor is provided. The method includes receiving motor specifications at a hardware processor, determining motor performance by a hardware processor in response to receiving the motor specifications, receiving vent arrangement information by a hardware processor, analyzing airflow by a hardware processor based on at least the vent arrangement information, and analyzing electromagnetic properties by a hardware processor based on at least the vent arrangement information.

According to yet another aspect, a system configured to facilitate ventilation in an induction motor is provided. The system includes one or more storage devices configured to store data and programming instructions, and one or more hardware processors coupled to the one or more storage devices and operative to execute the programming instructions. The one or more hardware processors, executing the programming instructions, are operative to receive motor specifications, determine motor performance in response to receiving the motor specifications, receive vent arrangement information, analyze airflow based on the vent arrangement information, and analyze electromagnetic properties based on the vent arrangement information and overall geometry.

Still other aspects, features, and advantages of the invention may be readily apparent from the following detailed description wherein a number of exemplary embodiments and implementations are described and illustrated, including the best mode contemplated for carrying out the invention. The invention may also be capable of other and different embodiments, and its several details may be modified in various respects, all without departing from the scope of the invention. Accordingly, the drawings and descriptions are to be regarded as illustrative in nature, and not as restrictive. The drawings are not necessarily drawn to scale. The invention covers all modifications, equivalents, and alternatives falling within the scope of the invention.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

The aforementioned problem of efficiently cooling an induction motor without adversely affecting the performance of the motor may be overcome by one or more embodiments of the invention. In one aspect, a rotor core assembly is provided with an arrangement of axial vents having a relatively large total cross-sectional area that may improve cooling efficiency without adversely affecting motor performance. In other aspects, systems and methods are provided that may allow the size of axial vents in a rotor core assembly to be increased, thus improving cooling efficiency, without adversely impeding and/or interfering with the flow of magnetic fields through the rotor core assembly, as will be explained in greater detail below with reference to FIGS. 1-10.

Figure 1:
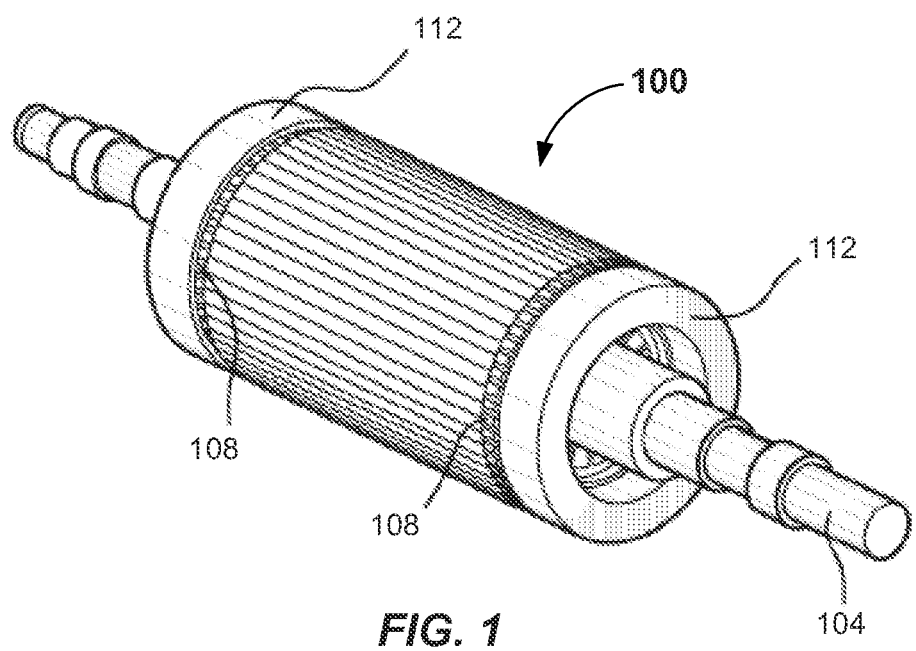
FIGS. 1 and 2 illustrate perspective and side views, respectively, of a rotor core assembly according to embodiments.
Figure 2:
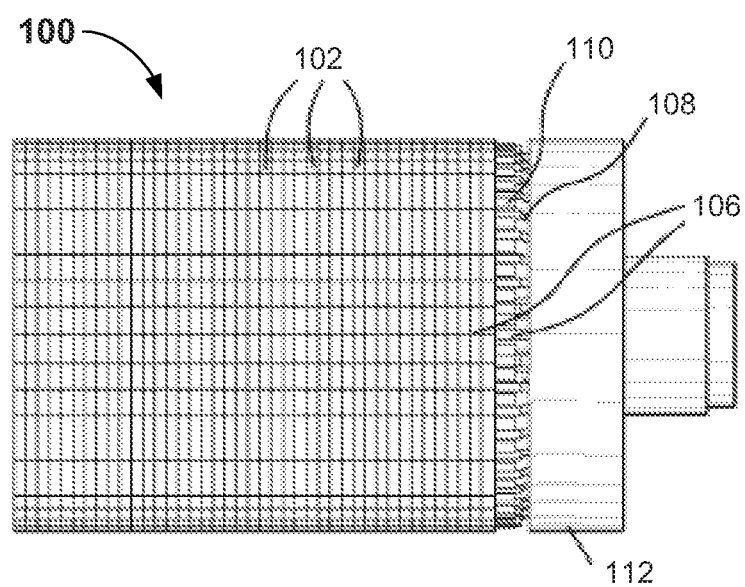

FIGS. 1 and 2 illustrate a rotor core assembly 100 that may be used in an induction motor in accordance with one or more embodiments. Rotor core assembly 100 may also be used in other suitable types of electric motors or machines. Rotor core assembly 100 may include a plurality of stacked rotor laminations 102, which may be a plurality of laminated steel plates or sheets (which are described in more detail below in connection with FIGS. 4 and 5). Rotor laminations 102 have a central bore and are configured to be received over a shaft 104. Rotor core assembly 100 may also include a plurality of rotor conductor bars 106 radially distributed around the periphery of rotor laminations 102 and received through a respective plurality of slots in rotor laminations 102. Rotor conductor bars 106 may define a pair of opposing bar end regions 108. Rotor core assembly 100 may further include a securement ring 110 and an end cap 112 on opposing axial ends, as shown. Rotor conductor bars 106 and/or end cap 112 may be made of, e.g., copper. Other suitable conductive material(s) may alternatively be used for rotor conductor bars 106 and/or end cap 112.

Figure 3:
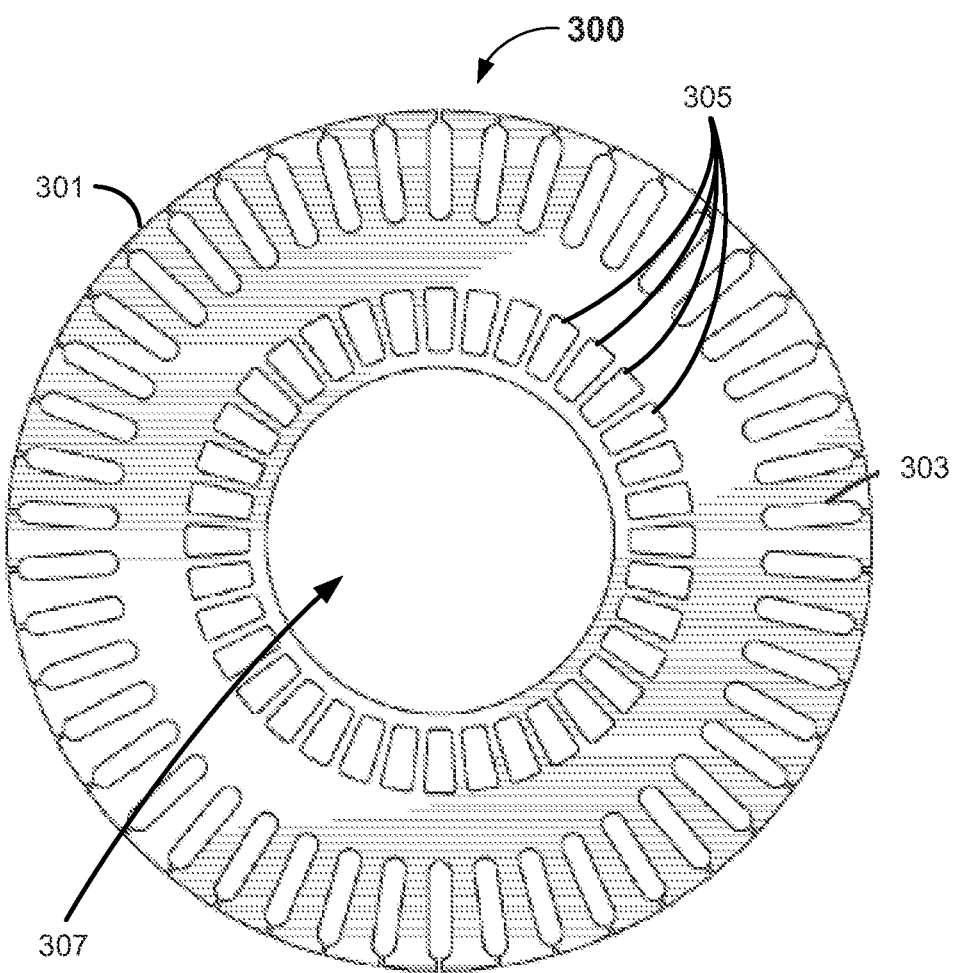
FIG. 3 illustrates a plan view of a rotor lamination configuration according to the prior art.

FIG. 3 illustrates a known configuration of a rotor lamination that may be used in a rotor core assembly. Rotor lamination 300 has an outer radial periphery 301, a plurality of slots 303, a plurality of axial vents 305, and a central bore 307. Slots 303 are arranged about radial periphery 301 and are each configured to receive there through a rotor conductor bar, such as, e.g., rotor conductor bar 106 of rotor core assembly 100. Central bore 307 is configured to receive there through a rotor shaft such as, e.g., shaft 104 of rotor core assembly 100. Axial vents 305 may be arranged in a ring around central bore 307 and may be openings that pass axially through a plurality of stacked rotor laminations 300 to provide a passageway for cooling air to be received through a rotor core assembly. However, the limited number and size of axial vents 305 may be inadequate to provide enough cooling air to keep some induction motors within a specified operating temperature range, particularly those, for example, providing high output power and/or operating in high temperature environments and/or at high speeds (usually measured in revolutions per minute (RPMs)).

Figure 4:
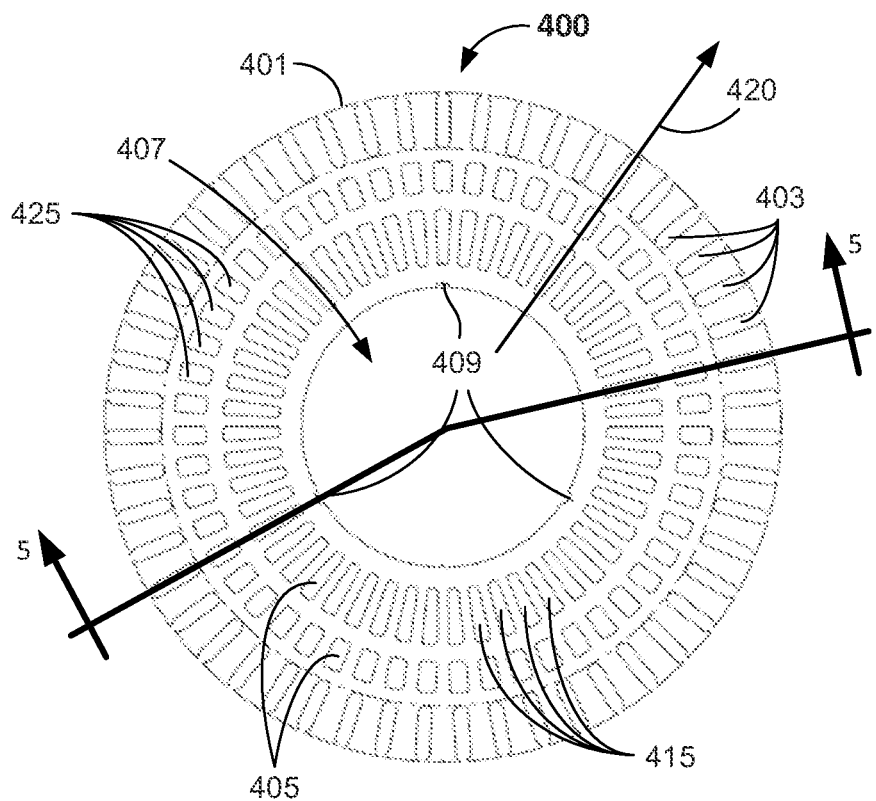
FIG. 4 illustrates a plan view of a rotor lamination configuration according to embodiments.

FIG. 4 illustrates a configuration of a rotor lamination having an improved arrangement of vents in accordance with one or more embodiments. Rotor lamination 400 may have an outer radial periphery 401, a plurality of slots 403, a plurality of axial vents 405, a central bore 407, and one or more optional rotational aligning members 409, which may be one or more keyways. Slots 403 may be arranged equidistantly around the edge of radial periphery 401, and may each be configured to receive there through a rotor conductor bar, such as, e.g., rotor conductor bar 106 of rotor core assembly 100. Rotor lamination 400 may alternatively have other suitable numbers, shapes, spacings, and/or arrangements of slots 403. Central bore 407 is configured to receive there through a rotor shaft, such as, e.g., shaft 104 of rotor core assembly 100. Central bore 407 may be of any suitable diameter that conforms to the size of the rotor shaft to be received. Rotational aligning members 409 may interface with mating aligning members, which may be keys, on a shaft received through central bore 407. Although three rotational aligning members 409 are shown, any number may be provided in some embodiments. Other types of aligning structures may alternatively be provided.

Axial vents 405 may be openings that pass axially through rotor lamination 400. Axial vents 405 may include a first set of axial vents 415 (a few shown labeled in FIG. 4) that may be arranged in a first circular row (i.e., a ring) and a second set of axial vents 425 (a few shown labeled in FIG. 4) that may be arranged in a second circular row (i.e., a ring). The second set of axial vents 425 may be positioned radially outward from the first set of axial vents 415. Vents 415 and/or vents 425 may have any suitable shape (e.g., trapezoidal, rectangular, elliptical, etc.). Furthermore, the first set of axial vents 415 may all have the same shapes and/or cross-sectional areas as each other. In some embodiments, one or more axial vents 415 may have a shape and/or a cross-sectional area different than another axial vent 415. Similarly, the second set of axial vents 425 may all have the same shapes and/or cross-sectional areas as each other. In some embodiments, one or more axial vents 425 may have a shape and/or a cross-sectional area different than another axial vent 425. Moreover, the first set of axial vents 415 may have a shape and/or a cross-sectional area different than a shape and/or a cross-sectional area of the second set of axial vents 425. In some embodiments, the first set of axial vents 415 may have shapes and/or cross-sectional areas identical to those of the second set of axial vents 425.

As shown in FIG. 4, each vent 415 may be aligned along a radial vector (see, e.g., radial vector 420) extending from central bore 407 to outer periphery 401 with a respective vent 425. In some embodiments, only some of vents 415 may be radially aligned with respective vents 425. As also shown in FIG. 4, each pair of radially aligned vents 415, 425 may be radially aligned with a respective slot 403 along a same radial vector such as radial vector 420. In one or more embodiments, the number of axial vents 415 and the number of axial vents 425 equal the number of slots 403. Alternatively, in some embodiments, one or more pairs of aligned vents 415, 425 may not be aligned with a respective slot 403. In other embodiments, only one or some axial vents 425, or only one or some axial vents 415, may be radially aligned with a respective slot 403.

Note that other suitable arrangements of axial vents 405 may alternatively be provided. For example, in some embodiments, a rotor lamination may have a third set of axial vents arranged in a third ring. Furthermore, each axial vent of the third set may be axially aligned with a first vent 415, a second vent 425, and/or a slot 403 along a radial vector such as radial vector 420.

Rotor lamination 400 may be manufactured from a laminated disc-shaped plate, which may be a ferrous material, such as, e.g., steel (including, e.g., laminated electrical steel or the like). Other suitable ferromagnetic materials may alternatively be used. The individual laminated disc-shaped plates may be stamped, laser cut, water jet cut, or the like.

Figure 5:
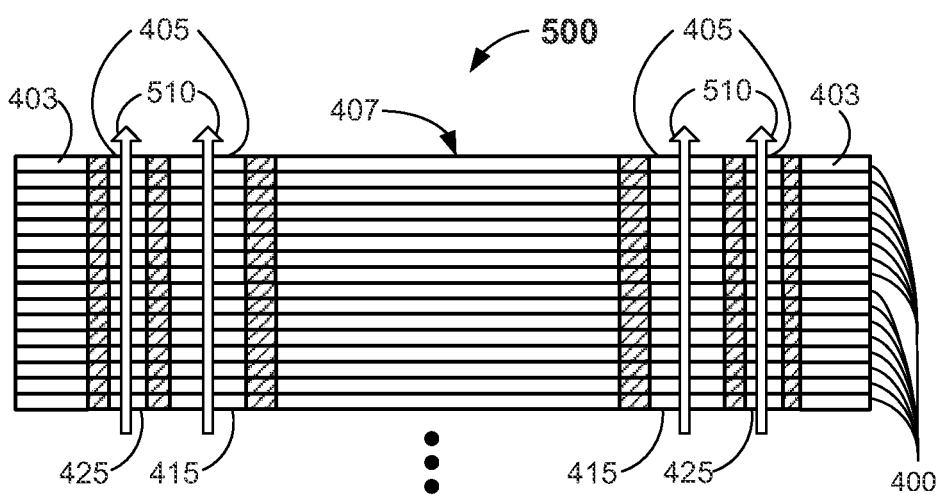
FIG. 5 illustrates a partial cross-sectional side view of a plurality of rotor laminations taken along section line 5-5 of FIG. 4.

As illustrated in FIG. 5, an arrangement of axial vents 405 in rotor lamination 400 may provide improved cooling in an induction motor or other suitable electric motor or machine in accordance with one or more embodiments. FIG. 5 shows a rotor lamination assembly 500 that comprises a stacked plurality of rotor laminations 400. (To avoid overcomplicating FIG. 5, optional rotational alignment members 409 are not shown.) The axial alignment of vents 405 may provide a plurality of passageways through vents 405 to allow cooling airflows 510 to pass there through to cool an induction motor incorporating rotor lamination assembly 500. Airflows 510 may, in some embodiments, be driven or drawn through vents 405 by a fan mounted on or near the rotor core assembly. In other embodiments, radial vents integrally constructed with the rotor core assembly may act as fans and thus create airflows 510. (Note that the direction of airflows 510 shown in FIG. 5 is arbitrary and may depend on, e.g., the source and location of one or more sources of airflow, such as a fan.) Some embodiments may have various structures, such as, e.g., vent spacers and/or vent fins (not shown) on or near a top rotor lamination 400 and/or between rotor laminations 400 to provide one or more radial cooling channels to direct airflows 510 radially into or out of vents 405. As compared to the number and total cross-sectional area of vents 305 in the known rotor lamination configuration of FIG. 3, vents 405 may allow significantly greater airflow through a rotor core assembly than vents 305. Accordingly, improved cooling may be provided. Moreover, as will be described in greater detail below, the vent arrangement of rotor lamination 400 may not significantly adversely affect the performance of an induction motor incorporating rotor laminations 400.

Figure 6:
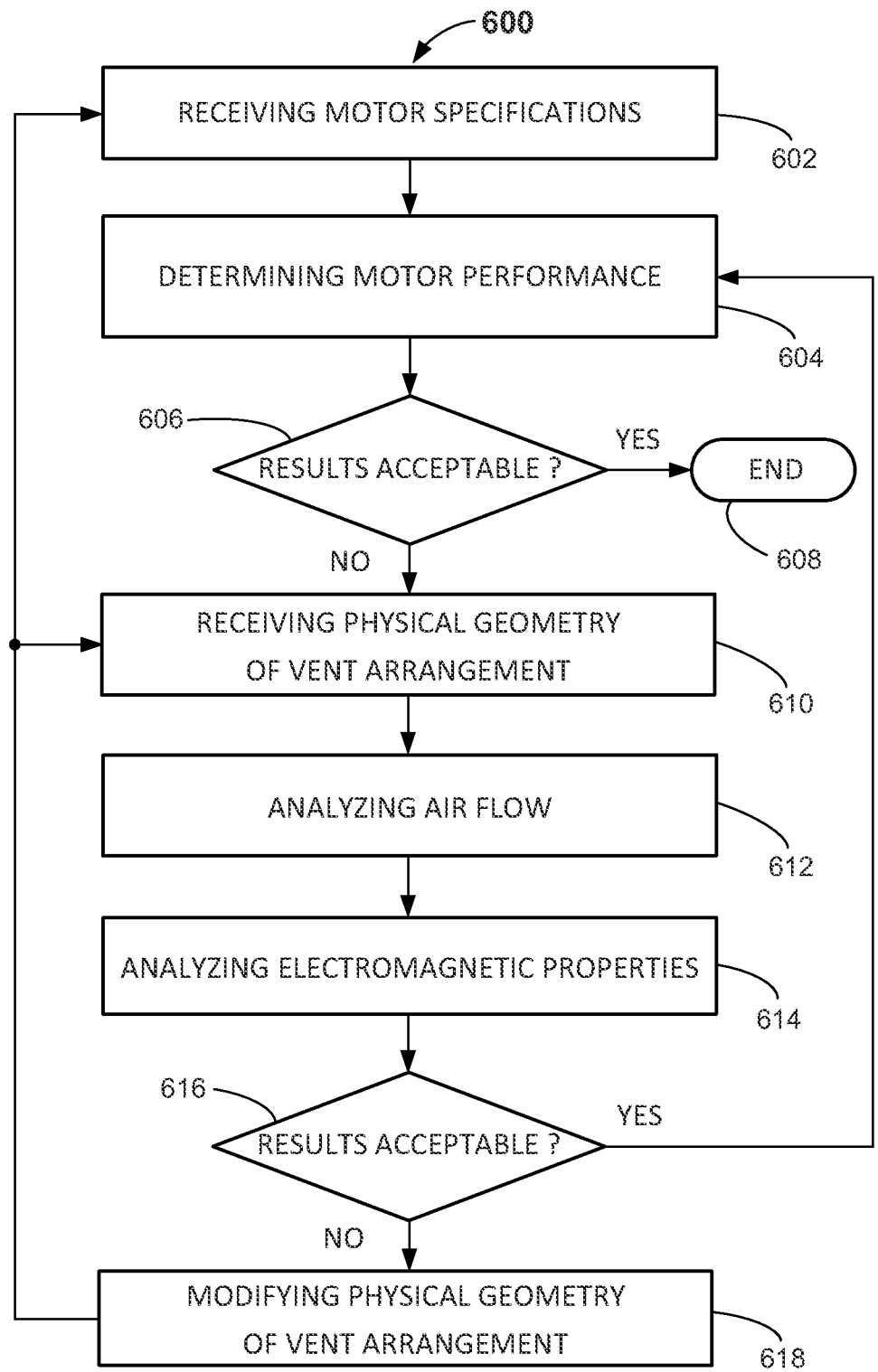
FIG. 6 illustrates a flowchart of a method of facilitating ventilation in an induction motor according to embodiments.

FIG. 6 illustrates a method of facilitating ventilation in an induction motor. Method 600 may be implemented by one or more hardware processors of a computer or computer system executing programming instructions in accordance with one or more embodiments. At block 602, a hardware processor may receive motor specifications. The motor specifications may include, e.g., one or more of the following: user-defined requirements such as, e.g., a hazardous area classification and/or an ambient temperature range; a starting load (e.g., torque and/or inertia); a starting duty value, a power value; a voltage value; a revolutions-per-minute value; a frequency value; motor component information; and/or rotor lamination vent information. The motor component information may include characteristics from a database for standard motor parts, such as, e.g., a shaft (e.g., stiff or flexible type, shaft diameter, etc.); a stator (e.g., dimensions, windings information, etc.), and/or a rotor (e.g., length and diameter dimensions, etc.).

Figure 7A:
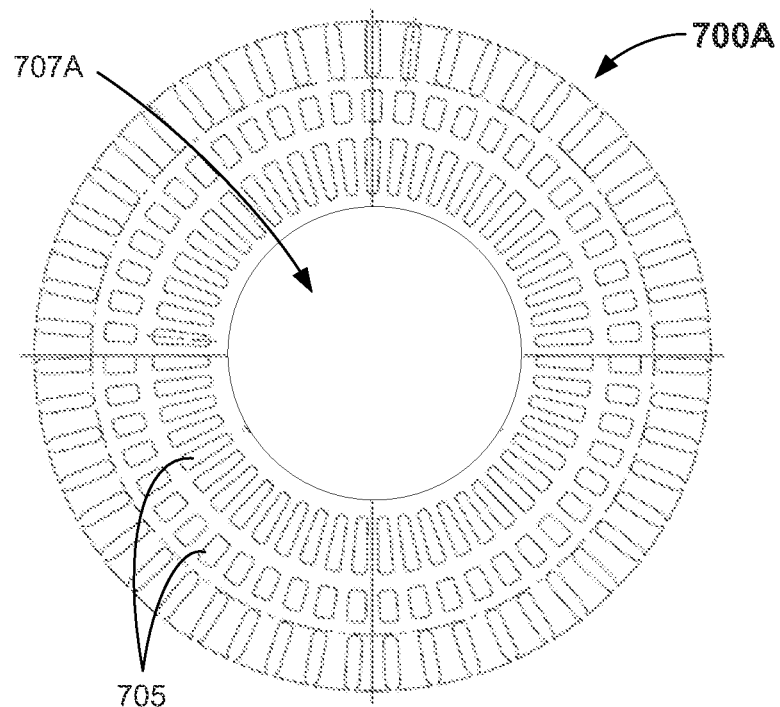
FIGS. 7A and 7B illustrate plan views of, respectively, an actual rotor lamination configuration and a modeled rotor lamination configuration according to embodiments.
Figure 7B:
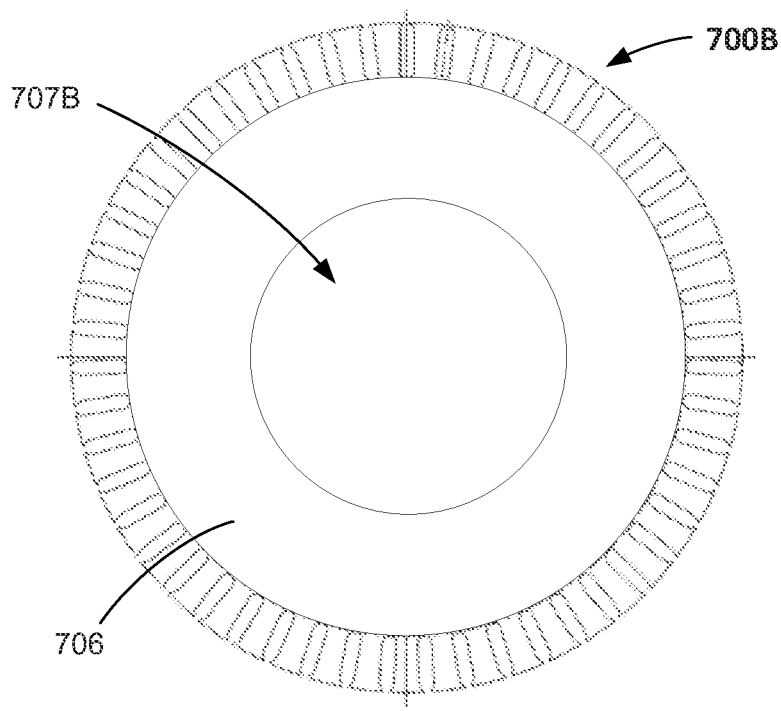

Rotor lamination vent information may include, e.g., a modeled rotor lamination equivalent having an effective solid area that takes into account the geometry/dimensions of an actual rotor lamination having a particular vent arrangement, as illustrated in FIGS. 7A and 7B. FIG. 7A shows an actual rotor lamination 700A that may have a central bore 707a and a plurality of vents 705 arranged in two circular rows. FIG. 7B shows a modeled rotor lamination equivalent 700B that may have a central bore 707b and an effective solid area 706 that may represent the total solid areas of rotor lamination 700A after taking into account the areas of vents 705 and central bore 707a. Modeled rotor lamination 700B may be part of the motor specifications received at block 602 by a hardware processor, and may be in a graphics form created by any suitable CAD (computer-aided design) program or tool. Alternatively, modeled rotor lamination 700B may be received at block 602 in any other suitable form. Other suitable rotor lamination vent information may be included in the motor specifications.

Returning to FIG. 6 at block 604, a hardware processor may determine motor performance based on the received motor specifications. Motor performance may include any one or more of the following: a torque, a current, a power loss, a power factor, an efficiency value, a duty value, an equivalent circuit, a temperature rise, an analytically and/or numerically-derived magnetic noise value, and/or an empirically-derived overall noise value. The hardware processor may retrieve various standardized and/or known data and/or previously calculated and stored data as needed from one or more storage devices in order to determine the motor performance. The hardware processor may be any suitable device capable of executing programming instructions, retrieving and storing data to and from memory, and performing various arithmetic and logic calculations and functions. The hardware processor may be, e.g., a microprocessor, digital signal processor, controller, or the like.

At decision block 606, results from block 604 are reviewed and, if the results are acceptable, method 600 may end at terminal block 608. Acceptable results may include, e.g., a calculated power output, torque, current, power loss, power factor, efficiency value, duty value, temperature, and/or noise value being in an acceptable or user defined range. If the results are not acceptable, method 600 may proceed to block 610. In some embodiments, the results of a first pass through block 604 may automatically be deemed unacceptable, wherein method 600 may then automatically proceed to block 610.

At block 610, a hardware processor may receive vent arrangement information that includes information about the physical geometry and/or dimensions of a vent arrangement configured on a rotor lamination, such as, e.g., the plurality of vents 405 of rotor lamination 400. The information may be in the form of a graphics layout, created by any suitable CAD program or tool, or in the form of a suitable listing of relevant information. Any other suitable form of representing a vent arrangement that indicates, e.g., cross-sectional areas of the vents, positioning of the vents on the rotor lamination, interconnections with other air passageways in one or more other parts of an induction motor, etc., may be used. Furthermore, other suitable information regarding the physical geometry and/or dimensions of a vent arrangement may also be received, and that information may be received in any suitable form.

Figure 8:
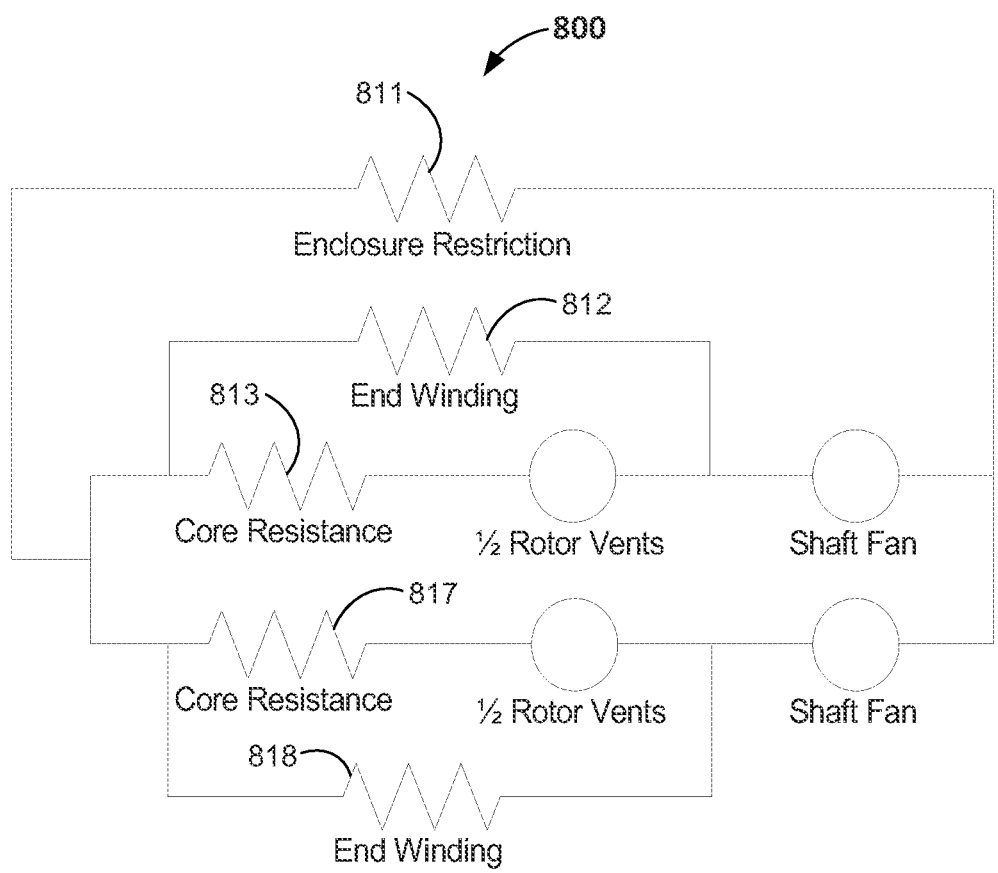
FIG. 8 illustrates an airflow network according to embodiments.

At block 612, a hardware processor may analyze airflow through an induction motor, including a rotor core assembly, based on one or more of the motor specifications received at block 602, the vent arrangement information received at block 610, and/or any other suitable information. Airflow analysis performed by the hardware processor may include identifying airflow sources and airflow restriction points, and calculating flow rates and pressure drops at various regions or points at or along one or more airflow passageways and/or rotor lamination vents. In some embodiments, a hardware processor may execute programming code that models and analyzes airflow through an induction motor as a one dimensional airflow network (analogous to an electrical network) as shown in FIG. 8. For example, airflow network 800 represents airflow restrictions using the symbol for a resistor, such as, enclosure restriction 811 end winding restrictions 812 and 818, and core resistances 813 and 817. Such software may allow for parameterization of the entire motor's various restrictions (orifices, passageways, etc.) and airflow sources (e.g., rotor, fans, etc.). This may allow for the calculation of flow rates through each region of the motor and pressure drops at all restrictions.

Figure 9:
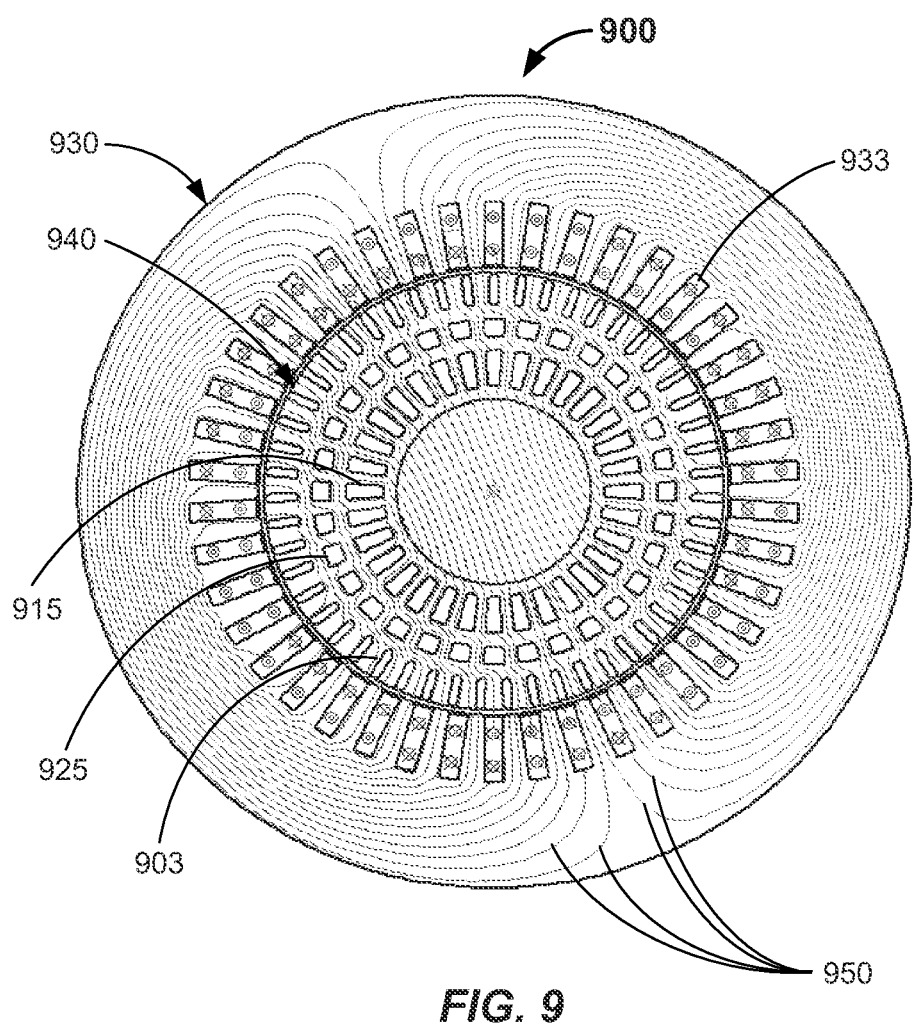
FIG. 9 illustrates a plan view of a stator and a rotor lamination showing magnetic field lines passing there through according to embodiments.

Returning to FIG. 6 at block 614, a hardware processor may analyze electromagnetic properties of the induction motor based one or more of the motor specifications received at block 602, the vent arrangement information received at block 610, and/or any other suitable information. This analysis may include calculating at least one of magnetic flux density, iron loss, saturation level, and/or magnetizing current. The hardware processor may execute programming instructions representing an interactive finite element electromagnetic analysis program that, among other things, calculates two-dimensional static or quasi-stationary electromagnetic fields and their parameters (e.g., fluxes, induction, forces, inductances, losses, etc.). Such a program may interface with a CAD system and may be, e.g., the program FEMAG, by the Institute of Electrical Machines of the Swiss Federal Institute of Technology, of Zürich, Switzerland. In some embodiments, the electromagnetic analysis performed at block 614 may include a graphics output that shows plotted magnetic field lines through a stator and a rotor lamination. As shown in FIG. 9, graphical representations of magnetic field lines may be useful in evaluating the electromagnetic effects of different vent arrangements in a rotor lamination.

FIG. 9 illustrates an example of a graphical image representing a stator 930 and a rotor core assembly 940 with a pattern of magnetic field lines 950 passing there through in accordance with some embodiments. Rotor core assembly 940 may be assembled from, e.g., a stacked plurality of rotor laminations 400. As shown, magnetic field lines 950 pass radially through rotor core assembly 940 around axial vents 915, axial vents 925, and slots 903, and through stator 930 around windings 933. Magnetic field lines 950 may represent magnetic flux, which may be considered the component of a magnetic field that passes through a surface. In some embodiments, magnetic flux may be proportional to the number of field lines shown passing through a surface. As shown in FIG. 9, magnetic field lines 950, which in this embodiment may be considered a desirably "meandering" flux path, are fairly evenly spaced apart throughout stator 930 and rotor core assembly 940. This may indicate that flux density is for the most part desirably uniform throughout stator 930 and rotor core assembly 940. Magnetic flux density may be considered a measure of the strength and direction of a magnetic field at a given point. High flux density may undesirably result in more magnetizing reactance, magnetizing current, and/or more magnetization losses. Generally, wider spacings between individual field lines, and/or no sharp deflections (such as around an axial vent) are usually desirable electromagnetic results in accordance with one or more embodiments.

Returning to FIG. 6, results of the airflow analysis and the electromagnetic analysis are reviewed at decision block 616. If the results of either the airflow analysis or the electromagnetic analysis are not acceptable, method 600 may proceed to block 618. Unacceptable airflow results may include, e.g., an airflow rate below an acceptable minimum, a pressure drop exceeding an acceptable limit, and/or an indication that air may undesirably recirculate within the motor. Note that other undesired airflow results may be deemed unacceptable.

Unacceptable electromagnetic results may include an indication that the rotor core is magnetically saturated, which may result in poor motor performance. Unacceptable results may also include, e.g., high flux density, high iron losses, and/or high magnetizing current in a particular area. Such conditions may be indicated on a plot of magnetic field lines where close spacing or compressing of field lines may indicate one or more problems such as high flux density. Close spacing or compressing of field lines may be caused by, e.g., excessively large axial vents, where too much active material of the rotor lamination may have been removed to create those large vents. Note that other undesirable electromagnetic results may be deemed unacceptable.

At block 618, modification of the physical geometry of the vent arrangement may be made. This may involve, e.g., changing the number, shape, size, and/or position of one or more vents and/or one or more rows of vents in a rotor lamination. Other suitable modifications to the physical geometry of the vent arrangement, rotor lamination, and/or any other part of an induction motor may be made in some embodiments. Any suitable graphics or CAD program may be used in one or more embodiments to make the modifications. Additionally or alternatively, modifications may be made using other suitable techniques. Upon completion of the modifications, method 600 may return to block 612, where a hardware processor analyzes airflow based on the modifications. Method 600 may then proceed to block 614, where a hardware processor analyzes electromagnetic properties based on the modifications.

If the results of the airflow analysis and the electromagnetic analysis are acceptable at decision block 616, method 600 may return to block 604, where a hardware processor may determine motor performance based on the most recent modifications made at block 618 and received at block 602. Note that before being received at block 602, modifications made at block 618 may be modeled as a rotor lamination equivalent having an effective solid area that takes into account the geometry/dimensions of the actual modified rotor lamination, as described above in connection with block 602 and FIGS. 7A and 7B.

Method 600 may be used to iteratively improve motor performance by modifying vent arrangements on rotor laminations and then analyzing the effects of those modifications on the airflow, electromagnetic properties, and performance of the motor. In some embodiments, method 600 may be used to optimize both airflow and magnetic flux through a rotor core assembly. For example, in some embodiments, the arrangement of vents in a rotor lamination, such as, e.g., vents 405 in rotor lamination 400, may represent an increase of as much as 80% in ventilation cross-sectional area in comparison to a known vent arrangement, such as that of, or similar to, e.g., rotor lamination 300. Such an increase in ventilation cross-sectional area may result in an approximate doubling of airflow through a rotor core assembly, with only about a 10% increase in magnetizing current as a consequence. Thus, as shown by magnetic field lines 950 in FIG. 9, an increase in ventilation cross-sectional area, as represented by vents 915 and 925, may not impede and/or otherwise significantly adversely affect the flow of magnetic fields through stator 930 or rotor core assembly 940.

It should be understood that the above steps of method 600 may be executed or performed in an order or sequence not limited to the order and sequence shown and described. Also, some of the above steps may be executed or performed substantially simultaneously or in parallel where appropriate or desired. For example, in some embodiments, blocks 612 and 614 may be performed in reverse order or substantially simultaneously or in parallel.

Figure 10:
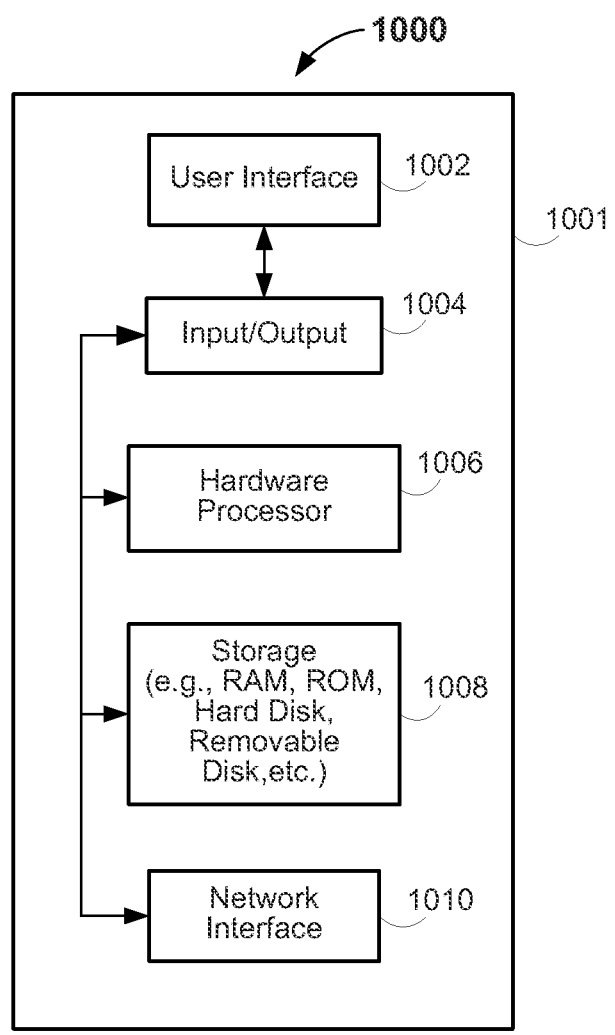
FIG. 10 illustrates a system configured to facilitate ventilation in an induction motor according to embodiments.

FIG. 10 shows a computer system 1000 that may be used to implement method 600 in accordance with some embodiments. System 1000 may include one or more computers 1001, which may be a general purpose device or a special purpose device, such as a server in a client/server based environment. For example, computer 1001 may be a personal computer, workstation, or laptop computer and/or may be a standalone device or part of a network. Computer 1001 may include any suitable components such as one or more of the following; a user interface 1002, an input/output device 1004, a hardware processor 1006 (which may be a microprocessor, digital signal processor, controller, etc.), a storage device 1008 (which may be a RAM, ROM, hard disk, removable disk, etc.), and a network interface 1010. User interface 1002 may include, e.g., a graphical user interface, and input/output device 1004 may include, e.g., a graphics display unit, wherein computer 1001 may further include one or more display controllers (not shown). Computer 1001 may be, e.g., suitable for running a CAD program. Hardware processor 1006 may execute programming instructions that may be stored in one or more storage devices 1008 to perform, for example, one or more functions of method 600. Storage device 1008 may be suitable for storing data and/or for maintaining one or more database systems. Network interface 1010 may establish communication with the Internet and/or any other suitable communications networks. Computer 1001 may further include other suitable communications interfaces for communicating directly with other devices, servers/computers, and/or peripherals.

Note that persons skilled in the art should readily appreciate that the invention described herein is susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although described in connection with an induction motor, the invention may be applicable to other suitable types of electric motors or machines. Accordingly, while the invention has been described herein in detail in relation to specific embodiments, it is to be understood that this disclosure is only illustrative and presents examples of the invention and is made merely for purposes of providing a full and enabling disclosure of the invention. This disclosure is not intended to limit the invention to the particular devices, systems or methods disclosed, but, to the contrary, the intention is to cover all modifications, equivalents, and alternatives falling within the scope of the invention.

What is claimed is:

1. A rotor core assembly of an induction motor, comprising:
   a plurality of rotor laminations, each rotor lamination comprising:
      a plurality of slots arranged around an outer radial periphery of a rotor lamination and passing through the rotor lamination, each slot configured to receive a rotor conductor bar there through;
      a first row of vents passing axially through the rotor lamination; and
      a second row of vents passing axially through the rotor lamination; wherein:
      each vent of the first row of vents has a first shape and each vent of the second row of vents has a second shape different from the first shape, and
      each vent of the first row is radially aligned with a respective vent of the second row, and each pair of radially aliened first and second vents is radially aligned with a respective slot of the plurality of slots along a same radial vector such that magnetic field lines passing radially through the plurality of rotor laminations around the first row of vents, the second row of vents and the plurality of slots are substantially evenly spaced apart throughout the rotor core assembly and a magnetic flux density is substantially uniform throughout the rotor core assembly.

2. The rotor core assembly of claim 1 wherein the first row of vents is arranged in a first ring and the second row of vents is arranged in a second ring.

3. The rotor core assembly of claim 1 wherein the second row of vents is positioned radially outward from the first row of vents.

4. The rotor core assembly of claim 1 wherein the plurality of slots, the first row of vents, and the second row of vents are equal in number.

5. The rotor core assembly of claim 1 further comprising:
   a plurality of rotor conductor bars inserted through the plurality of slots;
   a shaft upon which the plurality of rotor laminations are mounted; and
   a pair of end caps, each end cap mounted to a respective securement ring at an axial end of the rotor core assembly.

6. A rotor core assembly of an induction motor, comprising:
   a plurality of rotor laminations, each rotor lamination comprising:
      a plurality of slots arranged around an outer radial periphery of a rotor lamination and passing through the rotor lamination, each slot configured to receive a rotor conductor bar there through;
      a first row of vents passing axially through the rotor lamination; and
      a second row of vents passing axially through the rotor lamination; wherein:
      at least one vent of the first row of vents has a first shape and at least one vent of the second row of vents has a second shape different from the first shape, and
   each vent of the first row is radially aligned with a respective vent of the second row, and each pair of radially aligned first and second vents is radially aligned with a respective slot of the plurality of slots along a same radial vector such that magnetic field lines passing radially through the plurality of rotor laminations around the first row of vents, the second row of vents and the plurality of slots are substantially evenly spaced apart throughout the rotor core assembly and a magnetic flux density is substantially uniform throughout the rotor core assembly.

7. The rotor core assembly of claim 6 wherein the first row of vents is arranged in a first ring and the second row of vents is arranged in a second ring.

8. The rotor core assembly of claim 6 wherein the second row of vents is positioned radially outward from the first row of vents.

9. The rotor core assembly of claim 6 wherein the plurality of slots, the first row of vents, and the second row of vents are equal in number.

10. The rotor core assembly of claim 6 further comprising:
    a plurality of rotor conductor bars inserted through the plurality of slots;
    a shaft upon which the plurality of rotor laminations are mounted; and
    a pair of end caps, each end cap mounted to a respective securement ring at an axial end of the rotor core assembly.

* * * * *